United States Patent [19]
Meyer et al.

[11] Patent Number: 6,021,144
[45] Date of Patent: Feb. 1, 2000

[54] AUTOMATIC POWER CONTROL CIRCUIT FOR A LASER DRIVER

[75] Inventors: Charles S. Meyer, Nevada City; Jeffrey S. Evans, Grass Valley, both of Calif.

[73] Assignee: Nvision, Inc., Grass Valley, Calif.

[21] Appl. No.: 09/257,273

[22] Filed: Feb. 24, 1999

[51] Int. Cl.[7] ............................................. H01S 3/00
[52] U.S. Cl. ............................................. 372/38
[58] Field of Search ........................ 372/38, 29

[56] References Cited

U.S. PATENT DOCUMENTS

| | | | |
|---|---|---|---|
| 5,115,213 | 5/1992 | Eguchi . | |
| 5,313,482 | 5/1994 | Zelenka et al. | 372/38 |
| 5,341,399 | 8/1994 | Eguchi . | |
| 5,661,739 | 8/1997 | Ohashi | 372/38 |
| 5,675,599 | 10/1997 | Abe et al. | 372/38 |
| 5,736,844 | 4/1998 | Yanagisawa | 372/38 |
| 5,761,230 | 6/1998 | Oono et al. | 372/38 |
| 5,793,786 | 8/1998 | Furumiya | 372/38 |
| 5,850,409 | 12/1998 | Link | 372/38 |

OTHER PUBLICATIONS

F. CEliwczyński, M. Lipiński, P. Krehlik and A. Wolczko; "Laser Driving in Case of SDI Fibre Optic Transmission;" #97–15; Institute of Electronics, University of Mining and Metallurgy, Kraków, Poland.

*Primary Examiner*—Leon Scott, Jr.
*Attorney, Agent, or Firm*—Smith-Hill and Bedell

[57] ABSTRACT

An automatic power control circuit for a laser driver which is responsive to a data signal for driving a laser diode includes a low pass filter connected to receive the data signal and generate an output signal dependent on the DC content of the data signal. A circuit responsive to both an externally provided average power control signal and the output signal of the low pass filter controls supply of operating current to the laser diode.

5 Claims, 1 Drawing Sheet

AUTOMATIC POWER CONTROL CIRCUIT FOR A LASER DRIVER

BACKGROUND OF THE INVENTION

This application relates to an automatic power control circuit for a laser driver.

Referring to FIG. 1, in a conventional laser diode driver, which may be used for driving a laser diode in response to an electrical data signal for launching a corresponding optical data signal into an optical fiber, the laser diode D10 is connected between a positive supply rail +V and a node 14. Current is supplied to the node 14 by a transistor Q1, having its collector connected to the node 14 and its emitter connected to ground. An average power control signal $V_{ref}$ is applied to the non-inverting input of a differential integrating amplifier 18, whose output is connected to the base of the transistor Q1 through a loop filter composed of a resistor 22 and a capacitor 26. A monitor or feedback photodiode D30, which receives a small proportion of the optical energy emitted by the laser diode, is connected between the positive supply rail +V and a node 50, which is connected to ground through a resistor 38. The potential at the node 50 depends on the power output of the laser diode D10. The node 50 is also connected to the inverting input of the differential amplifier 18.

The incoming electrical data signal is applied to the base of a transistor Q2 through an inverter 40 and is applied directly to the base of the transistor Q3. The emitters of the transistors Q2 and Q3 are connected to a constant current source 42. The collector of the transistor Q2 is connected to the node 14 and the collector of the transistor Q3 is connected to the positive supply rail +V. When the data signal is high, the transistor Q2 is turned off and the transistor Q3 is turned on, and accordingly the current source 42 supplies no current to the laser diode D10, whereas when the data signal is low, the transistor Q2 is on and the transistor Q3 is off and the current source 42 supplies a relatively high current to the laser diode D10.

It is not desirable that current supplied by the transistor Q1 should be so low that when the data signal is high, and the transistor Q2 is off, the laser diode D10 should turn off, since operation in this mode adversely affects the rise and fall times of the optical signal generated by the laser diode. Conversely, if the current supplied to the laser diode D10 is too high when the transistor Q2 is on, the useful life of the laser diode is reduced.

The monitor diode D30, differential amplifier 18 and transistor Q1 operate as an automatic power control (APC) loop, controlling the average power level at which the laser diode D10 operates. Typically, the voltage of the signal $V_{ref}$ is selected so that the average power level in the presence of modulating data is about 50 percent of the maximum power at which the laser diode can operate without significantly reducing its useful life, and when the data signal is high, the laser diode operates at about 10 percent of its maximum power level whereas when the data signal is low, the laser diode operates at about 90 percent of its maximum level. This achieves a sufficient modulation depth to allow the data to be recovered at the receiving end of the fiber optic cable while ensuring that the laser diode does not turn off and is not overdriven.

The APC loop is characterized by a frequency response curve having a corner frequency which defines the maximum frequency at which energy coupled to the loop will influence operation of the laser diode D10. Energy at frequencies above the corner frequency will not affect the operation of the APC loop.

Energy at the frequency of the data signal is coupled into the APC loop by the laser diode D10 but operation of the APC loop should be independent of the frequency content of the data signal. Accordingly, the corner frequency of the loop should be below the minimum frequency present in the data signal. This condition is satisfied if the data signal has zero DC content and the runs of consecutive 1's and 0's are short.

In general, digital source data that is to be propagated over a channel is composed of multi-bit words, which are coded as a serial binary data stream for serial propagation.

When serial binary data is propagated over a channel, it is desirable that the baseband data have zero DC content. Many channel codes, such as Manchester and bi-phase codes, provide a baseband data stream which has zero DC content. When the channel code is selected so that the baseband data has zero DC content, the condition for proper operation of the APC loop is met provided that the runs of 1's and 0's are short.

The SMPTE 259 and SMPTE 292 standards for serial digital interface signals each prescribe a standard for mapping video data in the form of 10-bit words to a serial binary data stream. SMPTE 259 and SMPTE 292 each prescribe a polynomial, or PN, scrambler which functions well to generate baseband data having minimal DC content provided that the video data supplied to the scrambler is random, or nearly random. When the source of the video data is a camera, noise generated in the camera provides a sufficient degree of randomness. However, the content of some computer generated video data is not sufficiently random and the PN scrambler can generate baseband data having very long runs of consecutive 1's and 0's in response to these so-called pathological signals. These long runs of 1's and 0's generate a significant frequency content below the desired corner frequency of the conventional APC loop. In the case of a pathological signal, the DC content of the baseband data causes a typical automatic power control loop to force the average power level upwards or downwards in inverse proportion to the magnitude of the DC content of the signal. In the case of positive DC content, the average power output is reduced allowing the possibility of turning the laser off. In the case of negative DC content, the average power output is increased allowing the possibility of over-driving the laser. Even if these two extremes are not encountered, this data dependent modulation of the average power level is seen at the receiver as additional amplitude modulation which subtracts from the dynamic range of receiver circuitry, reducing the transmission loss budget and leading to difficulty in recovering the data at the receiving end of the optical fiber cable.

While it is theoretically possible to choose an APC loop with its corner frequency sufficiently low that it is transparent to the pathological signal, i.e. the pathological signal does not affect operation of the loop, this is not done in practice. The corner frequency would have to be as low as 10–100 Hz, depending upon the efficiency of the laser diode/feedback diode pair, in order to pass a SMPTE 259 or SMPTE 292 pathological signal. Unfortunately, the loop would then be too slow to compensate for component offset drifts due to thermal variations. These variations, left unchecked, generate similar amplitude modulation phenomena to the pathological signal, but because the variations are a strong function of temperature, even a short run of consecutive 1's and 0's may cause distortion. Therefore, based on laser physics and typical data rates, the APC corner frequency is usually set to approximately 1–4 kHz.

This invention allows the corner frequency of the APC loop to remain high, thus compensating for thermal dependent distortion, as well as long term laser aging, without over compensating for long strings of 1's and 0's.

SUMMARY OF THE INVENTION

In accordance with a first aspect of the invention there is provided an automatic power control circuit for a laser driver which is responsive to a data signal for driving a laser diode, the automatic power control circuit being responsive to an average power control signal and including a low pass filter connected to receive the data signal and generate an output signal dependent on DC content of the data signal, and a circuit responsive to both the average power control signal and the output signal of the low pass filter for controlling supply of operating current to the laser diode.

In accordance with a second aspect of the invention there is provided a laser driver which is responsive to a data signal for driving a laser diode, the laser driver comprising a modulated current source for supplying operating current to the laser diode and modulating the operating current in response to the data signal, and an automatic power control circuit responsive to an average power control signal for biasing the laser diode to operate at a selected average power level, the automatic power control circuit including a low pass filter connected to receive the data signal and generate an output signal dependent on DC content of the data signal, and a circuit responsive to both the average power control signal and the output signal of the low pass filter for supplying bias current to the laser diode.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 2:
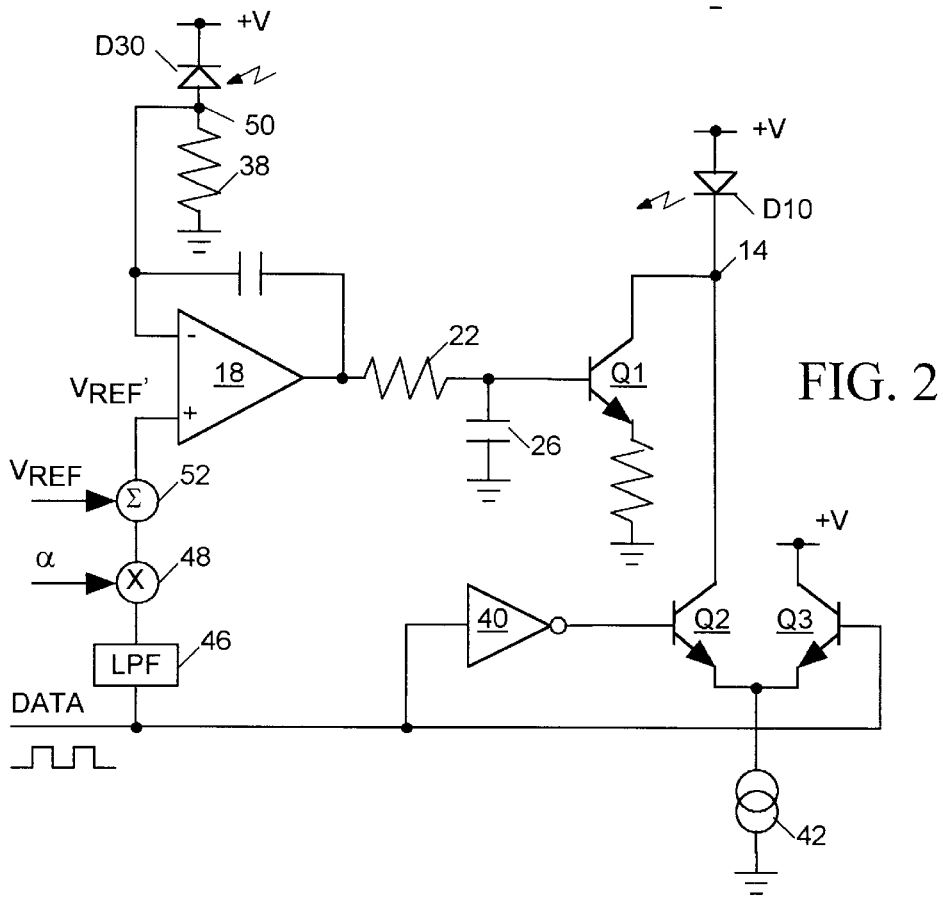
FIG. 2 is a schematic diagram of a laser driver provided with an automatic power control circuit in accordance with the present invention.

Referring to FIG. 2, the incoming electrical data signal is applied not only to the inverter 40 but also to a low pass filter 46 which generates an output signal $V_{DC}$ dependent on the DC level of the data signal. The output signal of the low pass filter is supplied to a multiplier 48, which multiplies the signal $V_{DC}$ by a scale factor $\alpha$ and the resulting feed forward correction factor is applied to one input of a summation circuit 52 which receives the average power control signal $V_{ref}$ at its other input. The summation circuit generates an adjusted average power control signal $V_{ref}'$, which is applied to the non-inverting input of the differential amplifier 18. The automatic power control circuit controls the base current supplied to the transistor Q1 so that the average power of the laser diode D10 depends on the adjusted average power control signal $V_{ref}'$, not the average power control signal $V_{ref}$.

Figure 1:
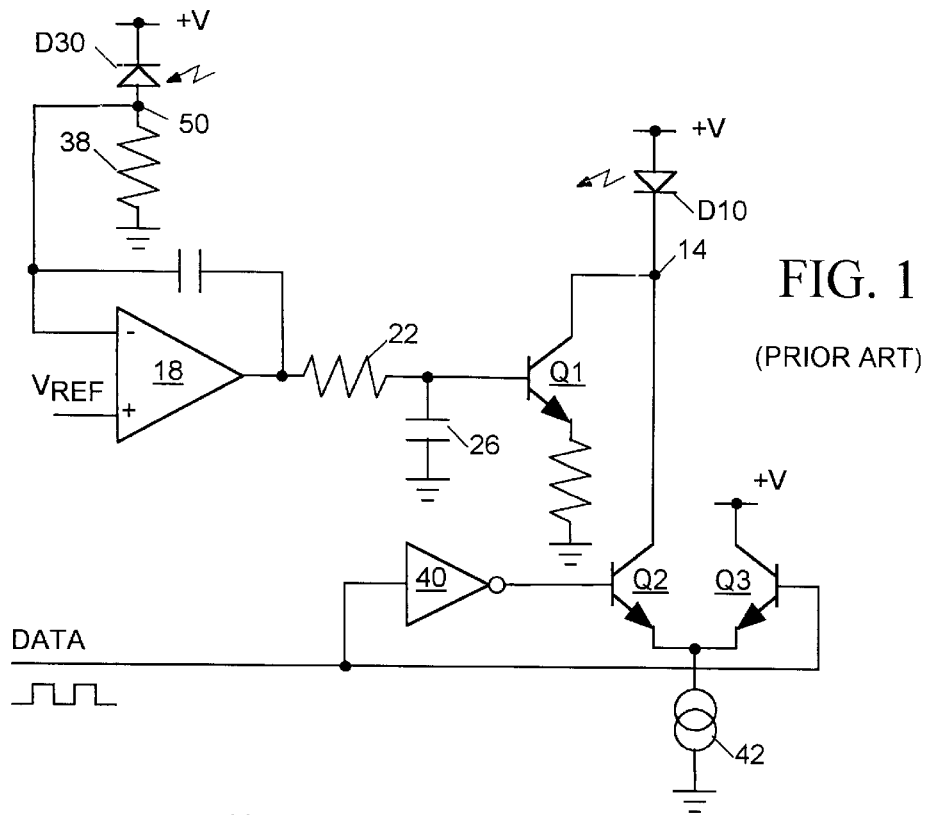
FIG. 1 is a schematic diagram of a laser driver provided with an automatic power control circuit in accordance with the prior art.

If the incoming electrical data signal has zero DC content, the output signal of the low pass filter 46 is zero and accordingly the voltage of the signal $V_{ref}'$ is equal to that of the signal $V_{ref}$ and the operation of the circuit shown in FIG. 2 is the same as that of the circuit shown in FIG. 1. If the data signal has non-zero DC content, the voltage $V_{DC}$, multiplied by the gain factor $\alpha$, is added to the voltage of the signal $V_{ref}$ to generate the signal $V_{ref}'$ so that the average power of the laser diode is adjusted in accordance with $V_{DC}$.

The corner frequency of the low pass filter 46 is chosen to equal the lowest frequency signal to be passed through the laser driver without distortion by virtue of the operation of the APC loop. In this way, the output voltage which is to be used as the feed forward correction factor to the APC circuit will decrease with decreasing DC content, allowing the typical APC loop to work as desired. The scale factor $\alpha$ is chosen based on the optical power transfer function between the laser D10 and the monitor diode D30, the loop bandwidth and order of the APC loop, the bandwidth and order of the low pass filter 46, and the desired output power level. Using these design parameters, and well known op amp circuits, as an example, $\alpha$ is chosen so that $V_{ref}'$ is adjusted by an amount equal and opposite to the value that $V_{ref}'$ would have been if the pathological signal were present at the input of the circuit and $\alpha$ were held at zero. In other words, if, when $\alpha$ were held at zero, the pathological signal forced the output of the amplifier 18 to change from V to V−$\Delta$V, then $\alpha$ and the corner frequency of the low pass filter 46 are chosen so that $V_{ref}'$ holds the output of the amplifier at V, even though the APC feedback voltage would say otherwise. Yet a third way to describe this is that $\alpha$ and the low pass filter 46 are chosen so that $V_{ref}'$ will be equal to the voltage generated by the feedback diode D30 and resistor 38 while the pathological signal is setting the output power level. In this way, there will be no power correction made in the loop, and the output of the amplifier 18 will not change, since the frequency of the baseband data is known to be outside the control bandwidth of the loop. Consequently, the depth of modulation is maintained and data can be reliably recovered at the receiving end regardless of the fact that the baseband data has non-zero DC content.

It will be appreciated that the invention is not restricted to the particular embodiment that has been described, and that variations may be made therein without departing from the scope of the invention as defined in the appended claims and equivalents thereof. For example, in a practical implementation the low pass filter might be a bandpass filter having its lower corner frequency at 1 or 2 Hz, so that the loop does not saturate in the event of a pure DC input. Although such a filter blocks very low frequencies, it is nevertheless considered a low pass filter within the meaning of the invention because the stop band is very much narrower than the pass band and the lower corner frequency is very much lower than the upper corner frequency.

We claim:

1. An automatic power control circuit for a laser driver which is responsive to a data signal for driving a laser diode, the automatic power control circuit being responsive to an average power control signal and including:
   a low pass filter connected to receive the data signal and generate an output signal dependent on DC content of the data signal, and
   a circuit responsive to both the average power control signal and the output signal of the low pass filter for controlling supply of operating current to the laser diode.

2. A circuit according to claim 1, wherein the circuit responsive to both the average power control signal and the output signal of the low pass filter comprises a multiplier for multiplying the output signal of the low pass filter by a gain factor and a summation circuit for additively combining the output signal of the multiplier and the automatic power control signal to generate an adjusted average power control signal.

3. A laser driver which is responsive to a data signal for driving a laser diode, the laser driver comprising:
- a modulated current source for supplying operating current to the laser diode and modulating the operating current in response to the data signal, and
- an automatic power control circuit responsive to an average power control signal for biasing the laser diode to operate at a selected average power level, the automatic power control circuit including:
  - a low pass filter connected to receive the data signal and generate an output signal dependent on DC content of the data signal, and
  - a circuit responsive to both the average power control signal and the output signal of the low pass filter for supplying bias current to the laser diode.

4. A laser driver according to claim 3, wherein the automatic power control circuit includes a differential integrating amplifier having an inverting input which receives a signal representative of average power output of the laser diode, an output connected to a variable current source for controlling supply of bias current to the laser diode, and a second input which receives an adjusted average power control signal.

5. A laser driver according to claim 3, wherein the circuit responsive to both the average power control signal and the output signal of the low pass filter comprises a multiplier for multiplying the output signal of the low pass filter by a gain factor and a summation circuit for additively combining the output signal of the multiplier and the automatic power control signal to generate an adjusted average power control signal.

* * * * *